(12) United States Patent
Kobayashi et al.

(10) Patent No.: US 11,159,760 B2
(45) Date of Patent: Oct. 26, 2021

(54) PHOTOELECTRIC CONVERSION APPARATUS, IMAGING SYSTEM, MOBILE BODY AND SIGNAL PROCESSING APPARATUS

(71) Applicant: CANON KABUSHIKI KAISHA, Tokyo (JP)

(72) Inventors: Hideo Kobayashi, Tokyo (JP); Satoshi Kato, Kawasaki (JP); Kohei Matsumoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/910,293

(22) Filed: Jun. 24, 2020

(65) Prior Publication Data

US 2020/0412992 A1 Dec. 31, 2020

(30) Foreign Application Priority Data

Jun. 26, 2019 (JP) .............................. JP2019-118701

(51) Int. Cl.
| | |
|---|---|
| *H04N 5/232* | (2006.01) |
| *H04N 5/3745* | (2011.01) |
| *H01L 27/146* | (2006.01) |
| *H04N 5/378* | (2011.01) |

(52) U.S. Cl.
CPC ....... *H04N 5/378* (2013.01); *H01L 27/14643* (2013.01); *H04N 5/23227* (2018.08); *H04N 5/37455* (2013.01)

(58) Field of Classification Search
None
See application file for complete search history.

(56) References Cited

U.S. PATENT DOCUMENTS 9,380,240 B2 * 6/2016 Yamaoka ............... H04N 5/378

FOREIGN PATENT DOCUMENTS

JP 2009-213012 A 9/2009

* cited by examiner

*Primary Examiner* — Mark T Monk
(74) *Attorney, Agent, or Firm* — Venable LLP

(57) ABSTRACT

A photoelectric conversion apparatus, comprising: a pixel array; a first and a second signal line groups; a first and a second readout circuit groups; a first multiplexer group that selects one of at least two first signal lines, and connects the selected first signal line to one first readout circuit; and a second multiplexer group that selects one of at least two second signal lines, and connects the selected second signal line to one second readout circuit, a number of the first readout circuits is more than a number of the first signal lines, a number of the second readout circuits is more than a number of the second signal lines, the selection operations by the first and second multiplexer groups are executable independently from each other, the selection operation of the first multiplexer group is controlled collectively, and the selection operation of the second multiplexer group is controlled collectively.

20 Claims, 12 Drawing Sheets

PHOTOELECTRIC CONVERSION APPARATUS, IMAGING SYSTEM, MOBILE BODY AND SIGNAL PROCESSING APPARATUS

BACKGROUND OF THE INVENTION

Field of the Invention

The present invention relates to a photoelectric conversion apparatus, an imaging system, a mobile body and a signal processing apparatus.

Description of the Related Art

Patent Literature 1 discloses a photoelectric conversion apparatus in which a redundant (extra) column circuit, to read a signal from a pixel, is disposed. The photoelectric conversion apparatus (solid-state imaging apparatus) disclosed in Japanese Patent Application Publication No. 2009-213012 includes column circuits of which number is more than a number of pixel columns by one, and includes a switch (multiplexer) that can switch between two adjacent column circuits to which a pixel signal is output. In the case of a photoelectric conversion apparatus according to Japanese Patent Application Publication No. 2009-213012, even if one of the column circuits fails, recovery from the failure can be executed by switching using a switch.

The photoelectric conversion apparatus according to Japanese Patent Application Publication No. 2009-213012, however, does not have a configuration that can effectively use a plurality of redundant column circuits, even if these redundant column circuits are disposed.

SUMMARY OF THE INVENTION

With the foregoing in view, it is an object of the present invention to provide a photoelectric conversion apparatus which includes a plurality of redundant column circuits, and in which the plurality of redundant column circuits can be effectively used.

The first aspect of the disclosure is a photoelectric conversion apparatus, that includes: a pixel array that includes a plurality of pixels disposed two-dimensionally; a first signal line group and a second signal line group that each read out signals of the pixel array; a first readout circuit group of which each first readout circuit reads out a signal from at least one signal line of the first signal line group; a second readout circuit group of which each second readout circuit reads out a signal from at least one second signal line of the second signal line group; a first multiplexer group that selects one of at least two first signal lines of the first signal line group, and connects the selected first signal line to one first readout circuit of the first readout circuit group; and a second multiplexer group that selects one of at least two second signal lines of the second signal line group, and connects the selected second signal line to one second readout circuit of the second readout circuit group, wherein a number of the first readout circuits is more than a number of the first signal lines, wherein a number of the second readout circuits is more than a number of the second signal lines, wherein the selection operation by the first multiplexer group and the selection operation by the second multiplexer group are executable independently from each other, wherein the selection operation of the first multiplexer group is controlled collectively, and wherein the selection operation of the second multiplexer group is controlled collectively.

The second aspect of the disclosure is a photoelectric conversion apparatus, that includes: a pixel array that includes a plurality of pixels disposed two-dimensionally; a first signal line group and a second signal line group that each readout signals of the pixel array; a first readout circuit group of which each first readout circuit reads out a signal from at least one first signal line of the first signal line group; a second readout circuit group of which each second readout circuit reads out a signal from at least a second signal line of the second signal line group; a first multiplexer that selects one of at least the first signal lines of the first signal line group, and connects the selected first signal line to one first readout circuit of the first readout circuit group; a second multiplexer that selects one of at least two second signal lines of the second signal line group, and connects the selected second signal line to one second readout circuit of the second readout circuit group, wherein the pixel connected to one first signal line of the first signal line group and the pixel connected to one second signal line of the second signal line group are disposed on a same pixel column.

The third aspect of the disclosure is a photoelectric conversion apparatus, comprising: a pixel array that includes a plurality of pixels disposed two-dimensionally; a first signal line group and a second signal line group that each reads out signals of the pixel array; a first readout circuit group including a readout circuit corresponding to each first signal line of the first signal line group and a readout circuit that is redundantly disposed for the first signal line group and the second signal line group; a second readout circuit group including a readout circuit corresponding to each second signal line of the second signal line group and a readout circuit that is redundantly disposed for the first signal line group and the second signal line group; a first multiplexer that is capable of switching whether at least one first signal line of the first signal line group is connected to a corresponding readout circuit or to a readout circuit that is different from the corresponding readout circuit; and a second multiplexer that is capable of switching whether at least one second signal line of the second signal line group is connected to a corresponding readout circuit or to a readout circuit that is different from the corresponding readout circuit, wherein the first multiplexer and the second multiplexer perform the same operation to determine whether the first signal line or the second signal line is connected to a corresponding readout circuit or a readout circuit that is different from the corresponding readout circuit.

The fourth aspect of the disclosure is a signal processing apparatus, that includes: a first signal line group and a second signal line group; a first readout circuit group of which each first readout circuit reads out a signal from at least one first signal line of the first signal line group; a second readout circuit group of which each second readout circuit reads out a signal from at least one second signal line of the second signal line group; a first multiplexer group that selects one of at least two first signal lines of the first signal line group, and connects the selected first signal line to one first readout circuit of the first readout circuit group; and a second multiplexer group that selects one of at least two second signal lines of the second signal line group, and connects the selected second signal line to one second readout circuit of the second readout circuit group, wherein a number of the first readout circuits is more than a number of the first signal lines, wherein a number of the second readout circuits is more than a number of the second signal lines, wherein the selection operation by the first multiplexer group and the selection operation by the second multiplexer group are executable independently from each other, wherein the selection operation of the first multiplexer group is controlled collectively, and wherein the selection operation of the second multiplexer group is controlled collectively.

According to the present invention, the plurality of redundant column circuits can be effectively used.

Further features of the present invention will become apparent from the following description of exemplary embodiments with reference to the attached drawings

DESCRIPTION OF THE EMBODIMENTS

The photoelectric conversion apparatus according to each embodiment will be described with reference to the drawings. These embodiments are merely for describing the present invention, and are not intended to limit the scope of the invention to these embodiments. A part of each embodiment may be combined with other embodiments when necessary.

Embodiment 1

Figure 1:
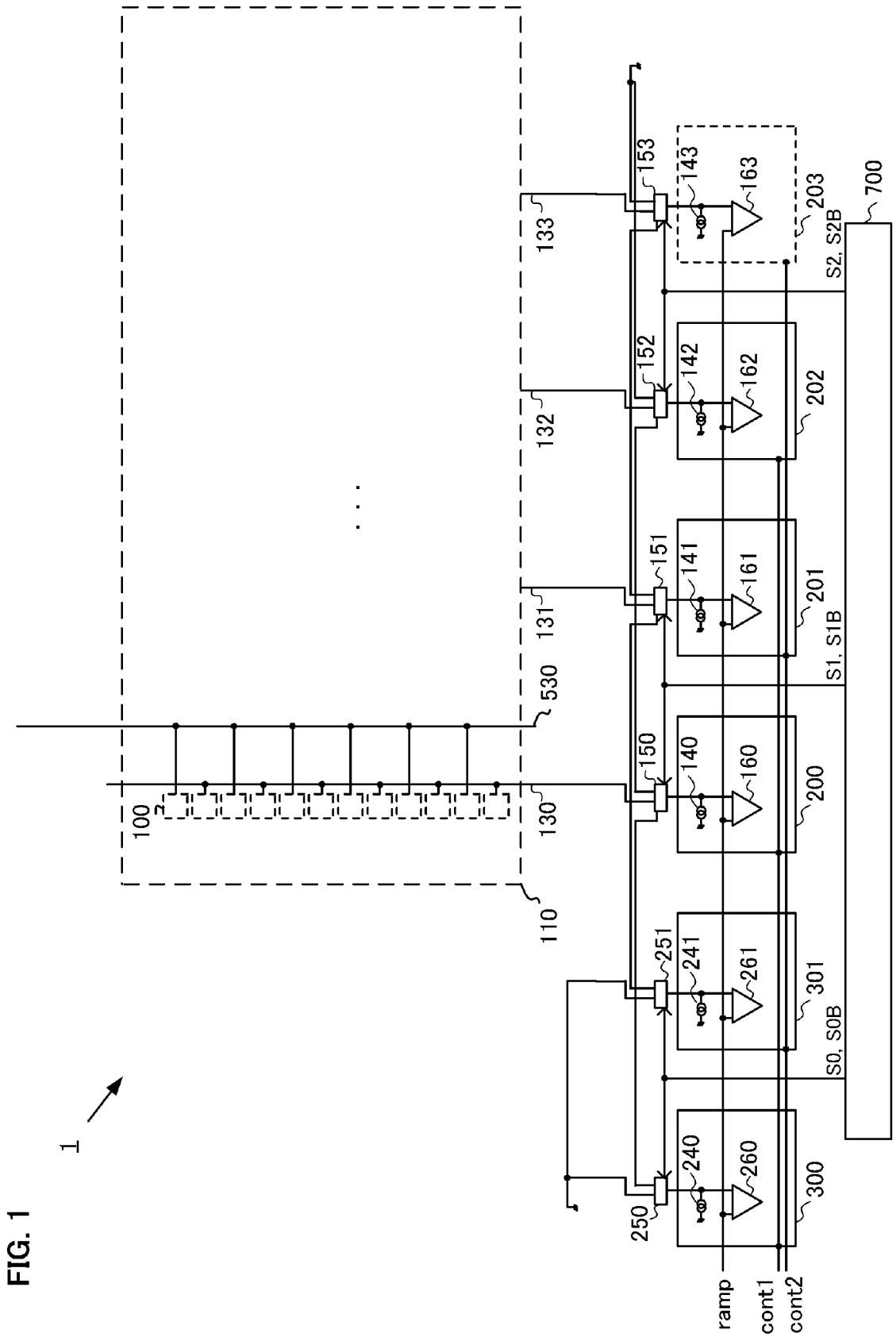
FIG. 1 is a schematic diagram of a photoelectric conversion apparatus according to Embodiment 1.

A photoelectric conversion apparatus 1 of Embodiment 1 is a CMOS image sensor. FIG. 1 is a schematic diagram of the photoelectric conversion apparatus 1 according to Embodiment 1.

In FIG. 1, 100 is a pixel, 110 is a pixel array, 130 to 133 and 530 are signal lines, 140 to 143, 240 and 241 are current sources, 150 to 153, 250 and 251 are multiplexers (MUX), and 160 to 163, 260 and 261 are comparators. 200 to 203 are column circuits, 300 and 301 are redundant column circuits, and 700 is a control circuit.

The photoelectric conversion apparatus 1 includes the pixel array 110 and a signal processing apparatus that reads a signal from the pixel array 110 and processes the signal. The signal processing apparatus includes signal lines 130 to 133 and 530, multiplexers 150 to 153, 250 and 251, column circuits 200 to 203, redundant column circuits 300 and 301, and control circuit 700.

In the pixel array 110, a pixel 100, which includes a photoelectric conversion element that generates photoelectric charges having an electric charge amount in accordance with the incident light quantity and stores the photoelectric charges inside, is two-dimensionally arrayed. Each signal of a pixel of an even row on one pixel column in the pixel array 110 is input to the multiplexers 150 to 153 via the signal lines 130 to 133 respectively. Each signal of a pixel of an odd row in the pixel array 110 is input to a multiplexer and a column circuit (not illustrated) via the signal line 530 or the like, and processed.

Each multiplexer 150 to 153, 250 and 251 is a circuit which has a plurality of (two in Embodiment 1) input nodes IN1 and IN2, and outputs one of the two inputs in accordance with a control signal. Corresponding signal lines 130 to 133 are directly connected to the input node IN1 of each multiplexer 150 to 153. An output from another multiplexer is connected to the input node IN2. For example, the output of the multiplexer 152 is connected to the input node IN2 of the multiplexer 150. In other words, a signal line, which is different from the signal line connected to the input node IN1, is connected to the input node IN2 via another multiplexer. As illustrated in FIG. 1, the input nodes IN1 of the redundant multiplexers 250 and 251 are connected to GND.

Each comparator 160 to 163, 260 and 261 compares a pixel signal with a ramp signal. The signal value of the ramp signal changes like slope, or in steps as time elapses. At a timing when the magnitude relationship between the ramp signal and the pixel signal is inverted, each comparator 160 to 163, 260 and 261 inverts the output signal. Based on the time until the magnitude relationship between the ramp signal and the pixel signal is inverted, each column circuit 200 to 203, 300 and 301 performs analog-digital conversion on the pixel signal. The circuit that reads the pixel signal (analog signal) as a digital signal corresponds to the readout circuit of Embodiment 1.

In Embodiment 1, the signal lines 130 and 132 on the odd pixel columns are equivalent to the first signal line group, and the signal lines 131 and 133 on the even pixel columns are equivalent to the second signal line group. The multiplexers 150 and 152, to which the signal lines 130 and 132 on the odd columns are directly connected, are equivalent to the first multiplexers, and the multiplexers 151 and 153, to which the signal lines 131 and 133 on the even columns are directly connected, are equivalent to the second multiplexers. The column circuits 200 and 202 (comparators 160 and 162), corresponding to the first multiplexers, and the redundant column circuit 300 correspond to the first readout circuit group. The column circuits 201 and 203 (comparators 161 and 163) corresponding to the second multiplexers, and the redundant column circuit 301 are equivalent to the second readout circuit group. The first readout circuit includes the readout circuits corresponding to the first signal lines and the readout circuit of the redundant configuration, hence a number of first readout circuits is more than a number of first signal lines. In the same manner, a number of second readout circuits is more than a number of second signal lines.

Figure 2:
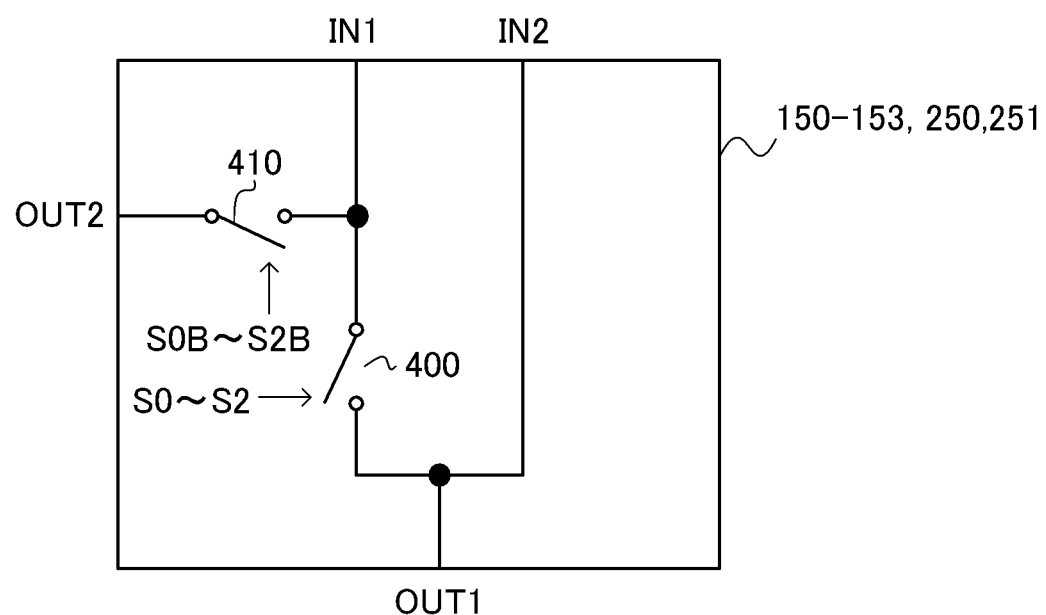
FIG. 2 is a diagram depicting a circuit example of a multiplexer.

FIG. 2 is a diagram depicting a circuit example of each multiplexer 150 to 153, 250 and 251. In FIGS. 2, 400 and 410 are switches. The ON/OFF state of the switch 400 is controlled by the control signals S0 to S2, and the ON/OFF state of the switch 410 is controlled by the control signals S0B to S2B. The control signals S0B to S2B are inverted signals of the control signals S0 to S2. Therefore the switch 400 and the switch 410 operate complementarily. In Embodiment 1, the same control signals are input to the corresponding two multiplexers on adjacent pixel columns. In concrete terms, the control signal S1 and S1B are input to the multiplexers 150 and 151, the control signals S2 and S2B are input to the multiplexers 152 and 153, and the control signals S0 and S0B are input to the multiplexers 250 and 251. The control signals are supplied from the control circuit 700.

Each multiplexer 150 to 153, 250 and 251 can switch operation by corresponding control signals S0 to S2 and S0B to S2B. In the case where the control signals S0 to S2 are set to high level and the control signals S0B to S2B are set to low level, the signal line directly connected to the input IN1 of the multiplexer is connected to the corresponding comparator via the output OUT1. The input IN2 of the multiplexer is connected to the switch 410 in the OFF state of another multiplexer. Therefore this operation can be regarded as an operation to connect a directly connected signal line to a corresponding readout circuit. In the case where the control signals S0 to S2 are set to low level and the control signals S0B to S2B are set to high level, on the other hand, the signal line directly connected to the input IN1 of the multiplexer is connected to another multiplexer (multiplexer on the left in the case of the circuit diagram in FIG. 1). If a signal line is connected from still another multiplexer (multiplexer on the right in the case of the circuit diagram in FIG. 1) via the input IN2, the multiplexer depicted in FIG. 1 connects this signal line to the corresponding comparator. This operation can be regarded as an operation to connect the directly connected signal line to the readout circuit via another multiplexer.

Normally the control signals S0 to S2 are set to high level, S0B to S2B are set to low level, the switch 400 is ON, and the switch 410 is OFF. In this case, in FIG. 1, the input IN1 of each multiplexer 150 to 153, that is, each signal line 130 to 133 directly connected to the multiplexer 150 to 153, is connected to the corresponding comparator 160 to 163 via the output OUT1 respectively. To the comparators 260 and 261 of the redundant column circuits 300 and 301, on the other hand, no signal line is connected, but GND is connected.

Now a case where at least one of the column circuits 200 and 201 failed will be described. In this case, the control circuit 700 inverts the control signals S0, S0B, S1 and S1B. In other words, the control signals S0 and S1 are set to low level, and S0B and S1B are set to high level. Thereby the signal line 130 can be connected to the comparator 260 by the redundant column circuit 300, and the signal line 131 can be connected to the comparator 261 of the redundant column circuit 301.

In the case where at least one of the column circuits 202 and 203 failed, the control circuit 700 inverts not only the control signals S0, S0B, S1 and S1B, but also the control signals S2 and S2B. In other words, the control signals S0 to S2 are set to low level, and S0B to S2B are set to high level. Thereby the signal lines 130, 131, 132 and 133 are connected to the comparator 260 of the redundant column circuit 300, the comparator 261 of the redundant column circuit 301, the comparator 160 of the column circuit 200, and the comparator 161 of the column circuit 201 respectively.

Figure 3:
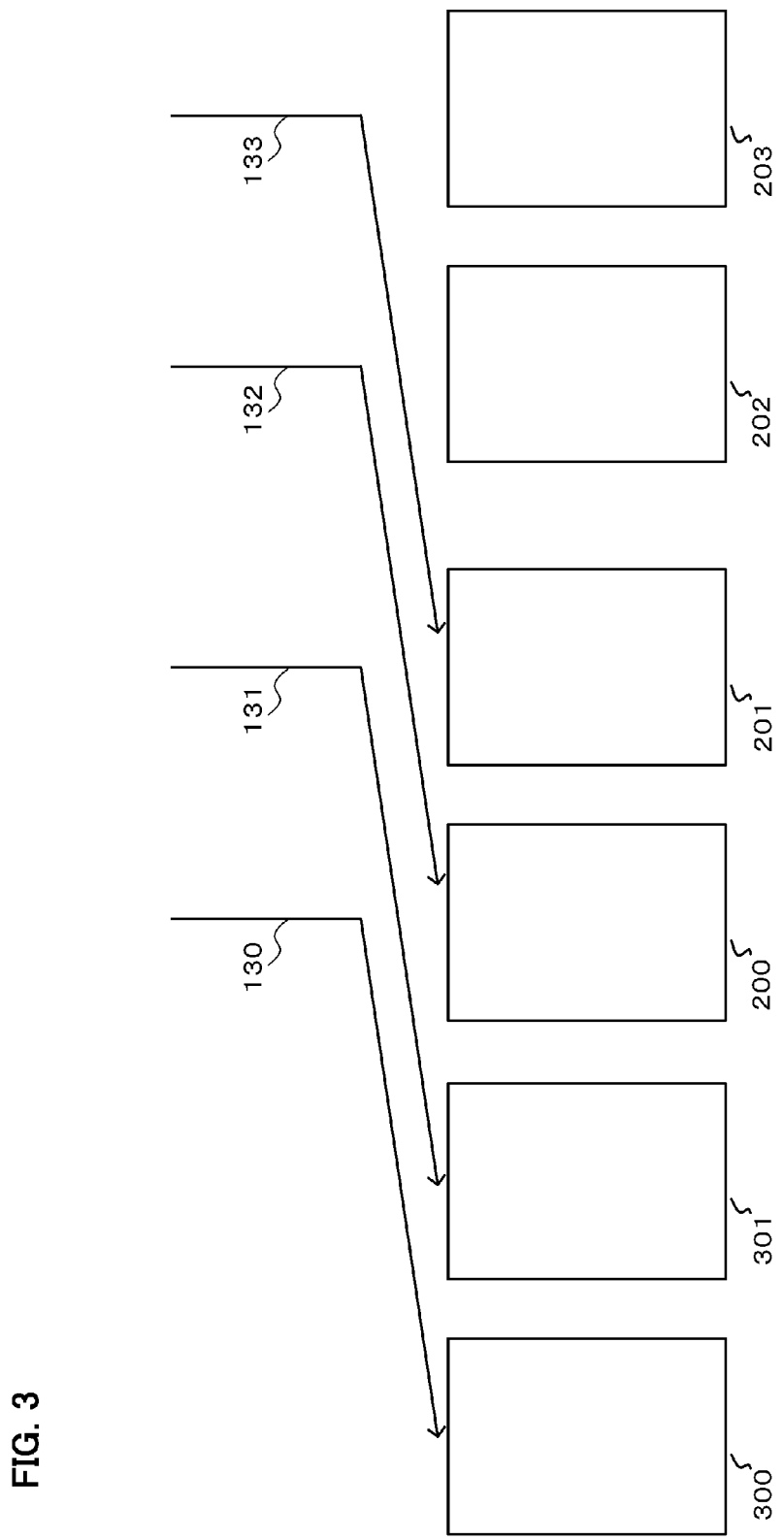
FIG. 3 is a diagram depicting a control example when a failure occurred in the photoelectric conversion apparatus according to Embodiment 1.

FIG. 3 is a schematic diagram depicting this state. As described above, if one column circuit fails, the readout destinations of the pixel signals on the column corresponding to the failed column circuit and the columns on the redundant circuit side thereof are shifted by the multiplexers. By this configuration, even if any one of the column circuits 200 to 203 fails, the signals from the pixel array 110 can be correctly read out, and yield of the photoelectric conversion apparatus can be improved.

Additionally in the case of the photoelectric conversion apparatus of Embodiment 1, the column circuit configurations and driving can be differentiated between even columns and odd columns, and the image quality deterioration in this case can be suppressed. These aspects will be described below.

In FIG. 1, the signal lines 130 and 132 on the odd columns are connected to the comparators of the redundant column circuit 300 on the odd column, or to the comparators of the column circuits 200 and 202 on the odd columns respectively. The signal lines 131 and 133 on the even columns are connected to the comparator of the redundant column circuit 301 on the even column, or to the comparators of the column circuits 201 and 203 on the even columns respectively. In this way, it is fixed, whether the pixel signal on the even column is input, or the pixel signal on the odd column is input, to the column circuit. In other words, the photoelectric conversion apparatus of Embodiment 1 has two multiplexer groups, that is, the first multiplexer group (150, 152) connected to the signal line group (signal lines 130, 132) on the odd columns, and the second multiplexer group (151, 153) connected to the signal line group (signal lines 131, 133) on the even columns. In this circuit configuration, operation to select the first multiplexer can be executed independently from the operation to select the second multiplexer. For example, regardless whether the second multiplexer 151 connects the signal line 131 to the comparator 161 or comparator 261, the first multiplexer 150 can connect the signal line 130 to either the comparator 160 or the comparator 260. In the same manner, the operation to select the second multiplexer can be executed independently from the operation to select the first multiplexer. Regardless whether the first multiplexer 150 connects the signal line 130 to the comparator 160 or the comparator 260, the second multiplexer 151 can connect the signal line 131 either to the comparator 161 or the comparator 261. The operation to select the first multiplexer group is controlled collectively. In other words, in the case where the first multiplexer 150 connects the signal line 130 to the comparator 160, the first multiplexer 152 connects the signal line 132 to the comparator 162, and in the case where the first multiplexer 150 connects the signal line 130 to the comparator 260, the first multiplexer 152 connects the signal line 132 to the comparator 160. In the same manner, the operation to select the second multiplexer group is controlled collectively. In other words, in the case where the second multiplexer 151 connects the signal line 131 to the comparator 161, the second multiplexer 153 connects the signal line 133 to the comparator 163, and in the case where the second multiplexer 151 connects the signal line 131 to the comparator 261, the second multiplexer 153 connects the signal line 133 to the comparator 161. By this configuration, connection destinations of a plurality of signal lines can be shifted collectively. Therefore even in the case of a pixel signal on the even column and a pixel signal on the odd column operate differently, operation of the column circuit on the even column and that on the odd column need not be switched, and recovery is easy even if a failure occurs.

In FIG. 1, control lines that are connected and control signals that are input are different between: the redundant column circuit 300 and the column circuits 200 and 202; and the redundant column circuit 301 and the column circuits 201 and 203. A control signal cont1 is input to the redundant column circuit 300 and the column circuits 200 and 202. Control signal cont2 is input to the redundant column circuit 301 and the column circuits 201 and 203. Therefore in the case where cont1/2 is a bias line to control the current consumption value, the current values of the current sources 140 to 143, 240 and 241 can be differentiated, or the current values of the comparators 160 to 163, 260 and 261 can be differentiated between the even columns and odd columns. By differentiating the current values of the current sources or the current values of the comparators, more specific control can be performed (e.g. while suppressing general power consumption, current value is increased only for green pixels, so as to reduce the noise of green pixels which have a significant influence on noise.) In the case where cont1/2 is a control line for power saving to switch the ON/OFF of the operation, the timing of power saving of the current sources 140 to 143, 240 and 241 can be differentiated between the even columns and odd columns, or the timing of the power saving of the comparators 160 to 163, 260 and 261 can be differentiated between the even columns and odd columns. In the case where cont1/2 is a control line to control the reset operation of the comparators 160 to 163, 260 and 261, the timing of the reset of the comparators 160 to 163, 260 and 261 can be differentiated between the even columns and odd columns. If a power save or a reset is executed for all the comparators simultaneously, power voltage may fluctuate, but this problem can be prevented by shifting the timings of the execution.

Figure 4:
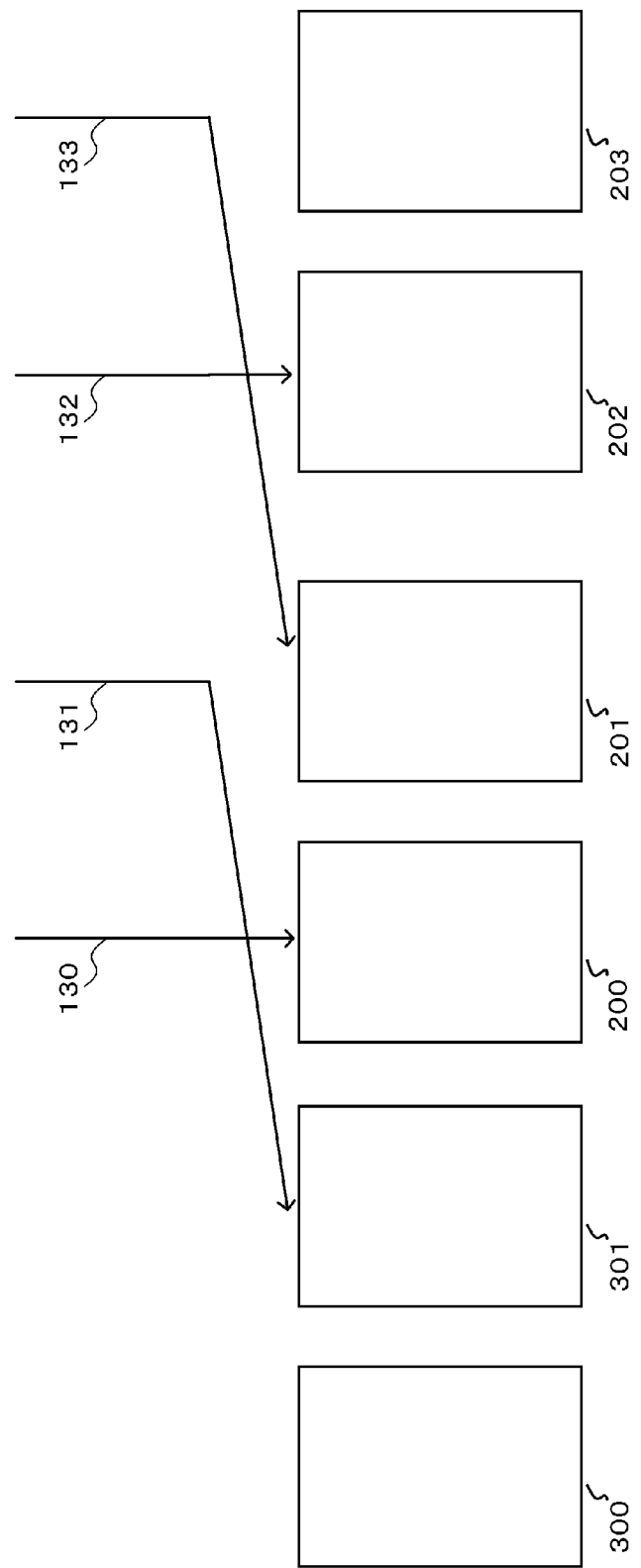
FIG. 4 is a diagram depicting another control example when a failure occurred in the photoelectric conversion apparatus according to Embodiment 1.

In Embodiment 1, the image quality deterioration caused by the generation of crosstalk from distant pixels is suppressed. A case where the column circuit 202 or 203 failed was described with reference to FIG. 3, but another example will be described with reference to FIG. 4. In the case where the column circuit 203 failed, the pixel signal can be read by shifting only the readout destinations of the signal lines 131 and 133 on the even columns, as illustrated in FIG. 4. The same is true in the case where one of the column circuits 200 and 202 failed. By this configuration, even if any one of the column circuits 200 to 203 fails, the signals from the pixel array 110 can be correctly read out, and yield of the photoelectric conversion apparatus can be improved.

In FIG. 4, however, the signal line 133, located at a position distant from the signal line 130, is input to the column circuit 201 next to the column circuit 200 to which the signal line 130 is input. Because of this, crosstalk is generated between the signal lines 130 and 133, which are distant from each other, in the case where crosstalk exists between column circuits. Crosstalk with a distant signal line tends to standout in an image.

In the example illustrated in FIG. 3, the readout destination of the pixel signals are simultaneously shifted for the even columns and odd columns, hence even if crosstalk is generated, the influence thereof is limited to the adjacent pixel columns, and the above mentioned image quality deterioration can be suppressed.

In the signal lines and column circuits of Embodiment 1, one group is formed by two columns (even column and odd column), but one group may be formed by three or more columns. In this case, three or more redundant column circuits are disposed, and if any one of the column circuits in a group fails, all the signal lines within the group are shifted to the redundant column circuits.

Modification 1 of Embodiment 1

In Embodiment 1, the same control signals are input from the control circuit 700 to the two multiplexers (e.g. 150 and 151) corresponding to adjacent columns, and these two multiplexers perform the same operation. However, the control circuit 700 may input independent control signals to each multiplexer. In this modification as well, if one column circuit fails, the even column and odd column are simultaneously shifted, just like Embodiment 1 (FIG. 3), whereby a similar effect as the above case can be acquired. Clearly when one column circuit fails in this modification, only one of the even and odd columns may be shifted, as illustrated in FIG. 4.

Further, in this modification, in the case where one column circuit in an even column and one column circuit in an odd column failed, the even column and odd column are shifted independently to recover from the failure. For example, a case where the column circuit 200 on the odd column and the column circuit 203 on the even column failed will be described. In this case, the readout destinations of the signal lines 131 and 133 on the even columns are shifted, and the signals are read out using the column circuits 301 and 201. For the signal lines on the odd columns, on the other hand, the readout destination of the signal line 132 is not shifted, and the signal is read out using the column circuit 202, and the readout destination of the signal line 131 is shifted, and the signal is read out using the column circuit 300.

This control is enabled because the photoelectric conversion apparatus of Embodiment 1 includes two multiplexer groups, that is, the first multiplexer group (150, 152) and the second multiplexer group (151, 153). The first multiplexers perform selection operation independently from the selection operation performed by the second multiplexers. In the same manner, the selection operation of the second multiplexers is performed independently from the selection operation performed by the first multiplexers. As a consequence, the connection destinations can be shifted only in one group.

According to this modification, it more likely to recover from failure even if two column circuits failed, and yield can be improved.

Modification 2 of Embodiment 1

The configuration illustrated in FIG. 1 is merely an example, and the configuration of the multiplexers 150 to 153, 250 and 251 may be any configuration if the simultaneous shift of the even and odd columns is possible, as mentioned above.

Figure 5:
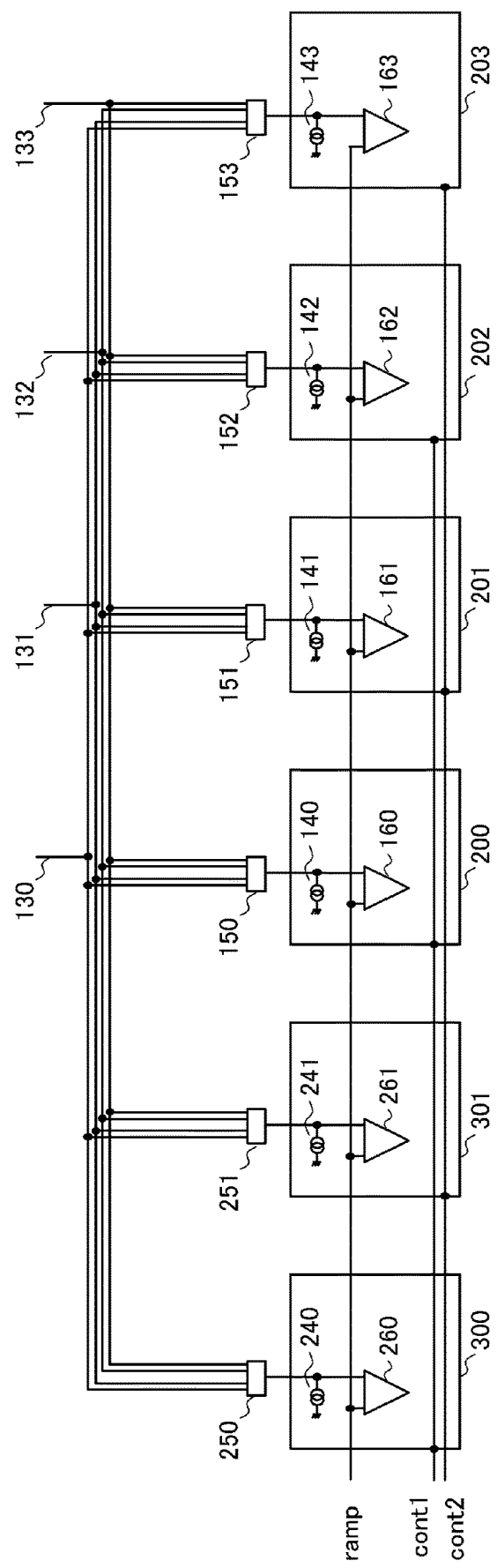
FIG. 5 is a schematic diagram of a photoelectric conversion apparatus according to a modification.

For example, FIG. 5 is a photoelectric conversion apparatus using multiplexers, each of which selects one of the four inputs and connects this input to the output. In this example, each of the multiplexers 150 to 153, 250 and 251 is connected to all of the signal lines 130 to 133 respectively. Each of the multiplexers 150 to 153, 250 and 251 selects one of the signal lines 130 to 133, and connects the selected signal line to the corresponding comparator 160 to 163, 260 and 261. In other words, each multiplexer includes an input IN1 to IN4, which are connected to the signal lines 130 to 133 respectively. The output of each multiplexer is connected to the corresponding comparator. Because of this configuration, all the signal lines 130 to 133 can be connected to all the redundant column circuits 300 and 301 and the comparators of all the column circuits 200 and 203. Therefore the photoelectric conversion apparatus illustrated in FIG. 5 can perform the same driving as FIG. 3. In this example, in the case of performing the same driving between the even column and odd column based on the same driving of cont1/2, the signal line on the odd column may be input to the column circuit on the even column, and the signal line on the even column may be input to the column circuit on the odd column.

In this modification, each multiplexer can select one of a plurality of signal lines 130 to 133 and connect this selected signal line to the corresponding comparator, regardless the selection operation of the other multiplexers. In other words, each multiplexer can perform an independent selection operation.

The pixel columns (signal lines) of the photoelectric conversion apparatus 1 may be divided into blocks, and the configuration illustrated in FIG. 5 may be used for each block. In other words, a plurality of redundant circuits may be provided for each block, so that all the signal lines in each block can be input to all the multiplexers and connected to all the column circuits. Then the same effect as the above configuration can be acquired, although a number of redundant circuits increases.

If the purpose is implementing a simultaneous shift of the even and odd columns, it is unnecessary to input all the signal lines to all the multiplexers as in FIG. 5. For example, signal lines 130 and 132 on the odd columns may be input to the multiplexers 200, 202 and 300 on the odd columns, and the signal lines 132 and 133 on the even columns may be input to the multiplexers 201, 203 and 301 on the even columns. By this configuration as well, driving the same as FIG. 3 can be performed.

Embodiment 2

Figure 6:
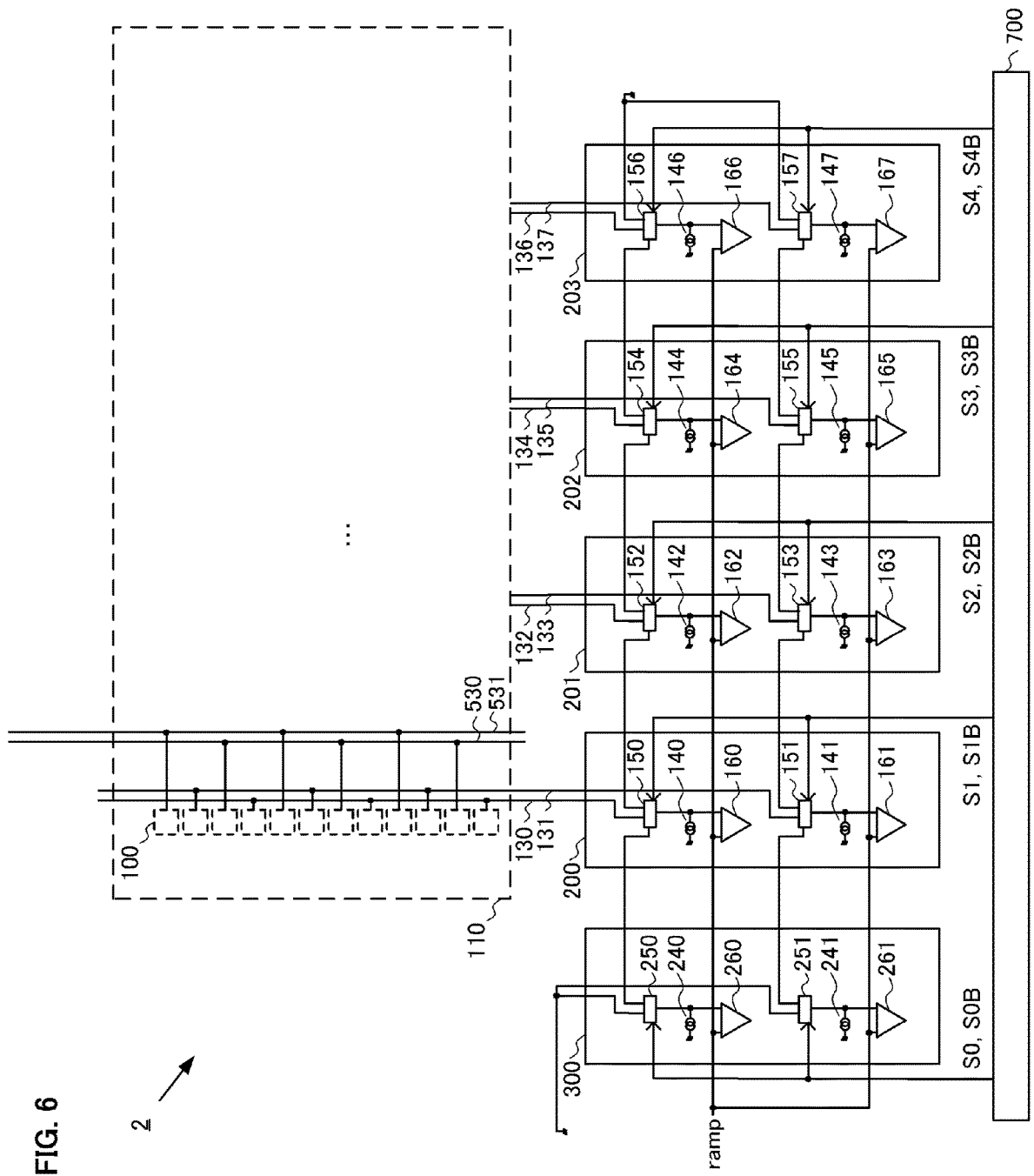
FIG. 6 is a schematic diagram of a photoelectric conversion apparatus according to Embodiment 2.

FIG. 6 is a schematic diagram of a photoelectric conversion apparatus (CMOS image sensor) 2 according to Embodiment 2. In the following, differences from Embodiment 1 will be primarily described. For the configuration that is not referred to here, the description of Embodiment 1 is applied. According to the example described in Embodiment 1, for the signal lines of two adjacent columns, when the column circuit which inputs a signal from one signal line is shifted, the column circuit that inputs a signal from the other signal line is shifted as well. In Embodiment 2, for two signal lines to read out the pixel signals from pixels of different rows on the same column, when the column circuit to which a signal is input from one signal line is shifted, the column circuit to which a signal from the other signal line is input is shifted as well.

In FIG. 6, there are four signal lines for one pixel column, and the signals of four rows of pixels 100 can be simultaneously read. For example, each pixel of an even row on one pixel column is input to the multiplexers 150 and 151 via the signal lines 130 and 131 alternately. For example, if the highest row in FIG. 6 is the first row, the pixel signals of the fourth row, eighth row and twelfth row are input to the multiplexer 150 via the signal line 130. The pixel signals of the second row, sixth row and tenth row are input to the multiplexer 150 via the signal line 130. Here the multiplexers 150 and 151 are controlled by the same control signals S1 and S1B. Signals on the other pixel columns are also input to the multiplexers 152 to 157 via the signal lines 132 to 137. The two multiplexers corresponding to the same pixel column are controlled by the same control signals S2 to S4 and S2B and S4B. In Embodiment 2 as well, the circuit example illustrated in FIG. 2 is used for each multiplexer.

In Embodiment 2, it is assumed that the column circuits corresponding to an even column and an odd column perform the same control. Therefore the same control signals cont are input to all the column circuits 200 to 203 and the redundant column circuit 300. A column circuit corresponding to an even column and a column circuit corresponding to an odd column may be controlled differently from each other, as illustrated in FIG. 1.

In FIG. 6, the column circuit includes the multiplexer, unlike FIG. 1, but it may be interpreted that the multiplexer is included in the column circuit or is not included in the column circuit. In FIG. 1, it is interpreted that the column circuit does not include the multiplexer, and in FIG. 6 the column circuit includes the multiplexer and the readout circuit.

In Embodiment 2, signal lines 130, 132, 134 and 136 on each pixel column are equivalent to the first signal line group, and the signal lines 131, 133, 135 and 137 are equivalent to the second signal line group. In this way, in Embodiment 2, the first signal line and the second signal line are signal lines to read out signals of pixels of different rows on the same pixel column. The multiplexers 150, 152, 154 and 156, to which the first signal lines 130, 132, 134 and 136 are directly connected, are equivalent to the first multiplexers. The multiplexers 151, 153, 155 and 157, to which the second signal lines 131, 133, 135 and 137 are directly connected, are equivalent to the second multiplexers. The comparators 160, 162, 164 and 166 corresponding to the first multiplexers 150, 152, 154 and 156, and the comparator included in the redundant column circuit 300 are equivalent to the first readout circuit group. The comparators 161, 163, 165 and 167 corresponding to the second multiplexers 151 153, 155 and 157, and the comparator included in the redundant column circuit 301 are equivalent to the second readout circuit group. The first readout circuits include the readout circuits corresponding to the first signal lines and the readout circuit of the redundant configuration, hence a number of the first readout circuits is more than a number of the first signal lines. In the same manner, a number of the second readout circuits is more than a number of the second signal lines.

Normally the control signals S0 to S4 are set to high level, S0B to S4B are set to low level, the switch 400 is ON, and the switch 410 is OFF. In this case, in FIG. 1, the input IN1 of each multiplexer 150 to 157, that is, each signal line 130 to 137 directly connected to the multiplexers 150 to 157, is connected to the corresponding comparators 160 to 167 via the output OUT1 respectively. On the other hand, to the comparators 260 and 261 of the redundant column circuit 300, no signal line is connected, but GND is connected.

Now a case where the comparator 160 in the column circuit 200 failed will be described. In this case, the control circuit 700 inverts the control signals S0, S0B, S1 and S1B. In other words, the control signals S0 and S1 are set to low level, and S0B and S1B are set to high level. Thereby the signal line 130 can be connected to the comparator 260 of the redundant column circuit 300. As a consequence, the signal from the pixel array 110 can be read out normally, and yield of the photoelectric conversion apparatus can be improved.

According to Embodiment 2, the signal line 130 corresponding to the failed comparator 160 is connected to the comparator 261 of the redundant column circuit 300. In addition, the signal line 131 related to (forming a pair with) the signal line 130 is also connected to the comparator 261 of the redundant column circuit 300. In other words, a plurality of signal lines of one pixel column are simultaneously shifted. Thereby image quality deterioration can be suppressed, as described below. If only the signal line 130 is connected to the comparator 260 of the redundant column circuit 300, only one comparator of the redundant column circuit 300 and one comparator of the column circuit 200 are connected with the signal line, and perform the comparison operation. This operation is different from that of the column circuits 201, 202 and 203, and can cause step differences in the image. In Embodiment 2, such image deterioration can be suppressed.

In the configuration of Embodiment 2, two readout circuits are disposed in one column circuit, but three or more readout circuits may be disposed in one column circuit.

Embodiment 3

Figure 7:
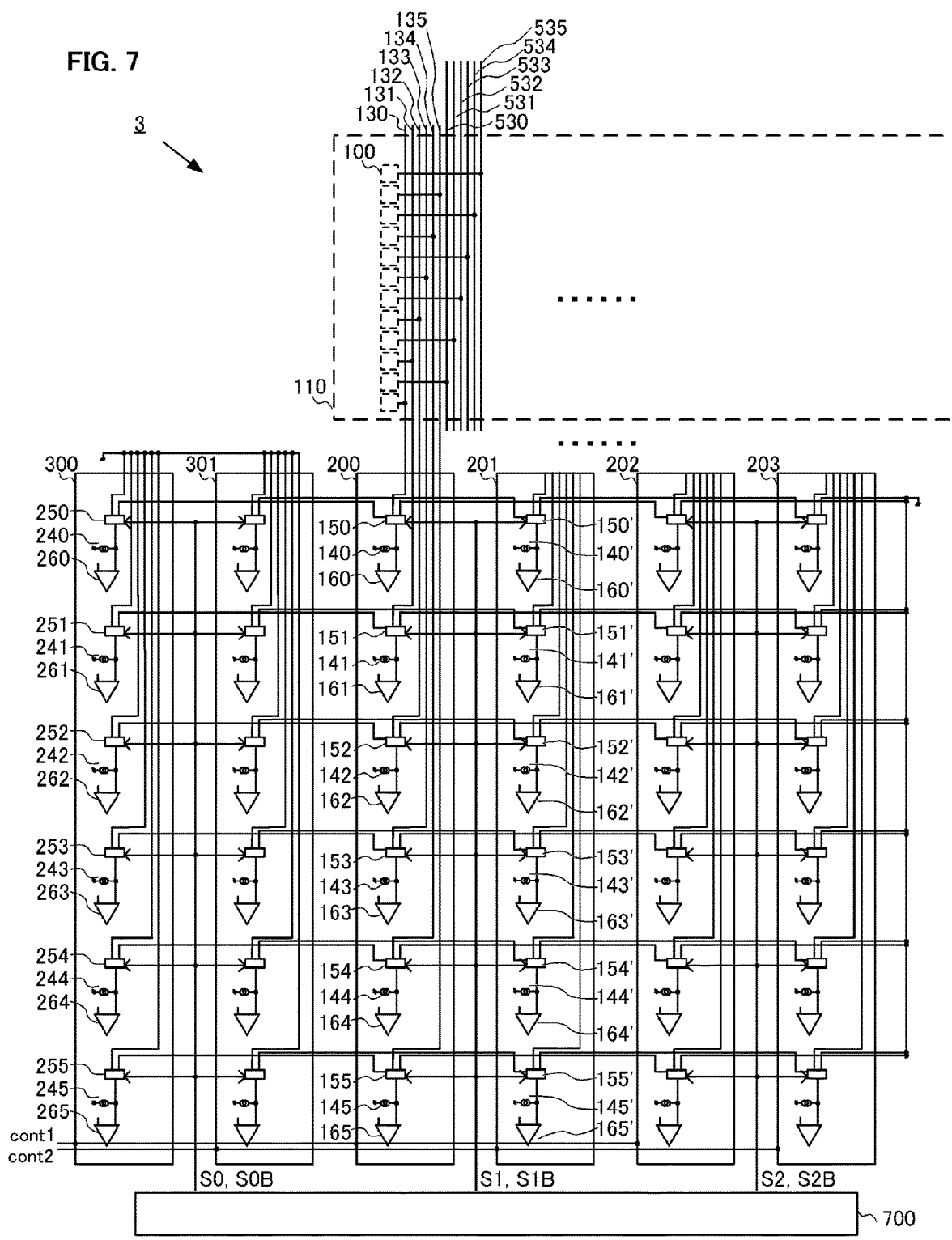
FIG. 7 is a schematic diagram of a photoelectric conversion apparatus according to Embodiment 3.

FIG. 7 is a schematic diagram of a photoelectric conversion apparatus (CMOS image sensor) 3 according to Embodiment 3. In the following, differences from Embodiment 2 will be primarily described. For the configuration that is not referred to here, description of Embodiment 1 or Embodiment 2 is applied. According to the example in FIG. 7, twelve signal lines are disposed on one pixel column, and signals of pixels 100 of twelve rows can be read out simultaneously. Out of the twelve signal lines on one pixel column, the six signal lines 130 to 135 connected to six pixels located in every other row are connected to the multiplexers 150 to 155 of the column circuit 200. The other six signal lines 530 to 535 are input to the multiplexers that are not illustrated. Six different signal lines connected to the other six pixels of the same rows are connected to the multiplexers of the column circuits 201, although this is not illustrated.

In Embodiment 3, the signal lines 130 to 135 of the pixel columns on an odd column are equivalent to the first signal line group, and the signal lines of the pixel columns on an even column are equivalent to the second signal line group. The multiplexers 150 to 155, to which the signal lines 130 to 135 on an odd column are directly connected, are equivalent to the first multiplexers, and the multiplexers, to which the signal lines on an even column are directly connected (e.g. multiplexers of the column circuit 201), are equivalent to the second multiplexers. The comparators 160 to 165 corresponding to the first multiplexers 150 to 155 are equivalent to the first readout circuit group, and the comparators corresponding to the second multiplexers are equivalent to the second readout circuit group.

In Embodiment 3, it may be interpreted that the signal lines on the pixel columns of the same row as the signal line 130, for example, are equivalent to the first signal line group, and the signal lines on the pixel columns of the same row as the signal line 131 are equivalent to the second signal line group, just like Embodiment 2. According to this interpretation, the multiplexer 150 is equivalent to the first multiplexer, and the multiplexer 151 is equivalent to the second multiplexer. The comparator 160 is equivalent to the first readout circuit, and the comparator 161 is equivalent to the second readout circuit.

Further, in Embodiment 3, it may be interpreted that the signal lines on the odd pixel columns of the same row as the signal line 130 are equivalent to the first signal line group, and the signal lines on the odd pixel columns of the same row as the signal line 131 are equivalent to the second signal line group. Further, it may be interpreted that the signal lines on the even pixel columns of the same row as the signal line 130 are equivalent to the third signal line group, and the signal lines on the even pixel columns of the same row as the signal line 131 are equivalent to the fourth signal line group. According to this interpretation, the multiplexer 150 is equivalent to the first multiplexer, and the multiplexer 151 is equivalent to the second multiplexer. The multiplexer 150' is equivalent to the third multiplexer, and the multiplexer 151' is equivalent to the fourth multiplexer. The comparator 160 is equivalent to the first readout circuit, the comparator 161 is equivalent to the second readout circuit, the comparator 160' is equivalent to the third readout circuit, and the comparator 161' is equivalent to the fourth readout circuit.

In Embodiment 3, independent control signals cont1 and cont2 are used for the column circuits on an even column and on an odd column, just like Embodiment 1. Furthermore, same control signals S0 and S0B are input from the control circuit 700 to all the multiplexers in the two column circuits 200 and 201, which correspond to adjacent pixel columns. In the same manner, common control signals S1 and S1B are input to all the multiplexers in the two common circuits 202 and 203, and same control signals S0 and S0B are input to all the multiplexers in the redundant column circuits 300 and 301.

Now a case where the comparator 160 in the column circuit 200 failed will be described. In this case, the control circuit 700 inverts the control signals S0, S0B, S1 and S1B. In other words, the control signals S0 and S1 are set to low level, and S0B and S1B are set to high level. Thereby the signal line 130 can be connected to the comparator 260 in the redundant column circuit 300. As a consequence, the signal from the pixel array 110 can be read out normally, and yield of the photoelectric conversion apparatus can be improved.

According to Embodiment 3, the signal lines 131 to 135 are also connected to the comparators 261 to 265 in the redundant column circuit 300, so as to make the number of comparators operating in the column circuits consistent, whereby image quality deterioration can be suppressed, just like Embodiment 2. Further, along with the shifting and connecting of the signal lines 130 to 135 to the comparators in the redundant column circuit 300, the signal line group connected to the multiplexers in the column circuit 201 is also shifted and connected to the comparators in the redundant column circuit 301. In this way, a plurality of signal lines corresponding to adjacent pixel columns, that is, a plurality of signal lines that are input to the adjacent column circuits, are collectively shifted. Thereby crosstalk with a distant location is suppressed, and image quality deterioration can be suppressed, just like Embodiment 1. Furthermore, different processing can be performed for a pixel column on an even column and pixel column on an odd column.

Embodiment 4

Figure 8:
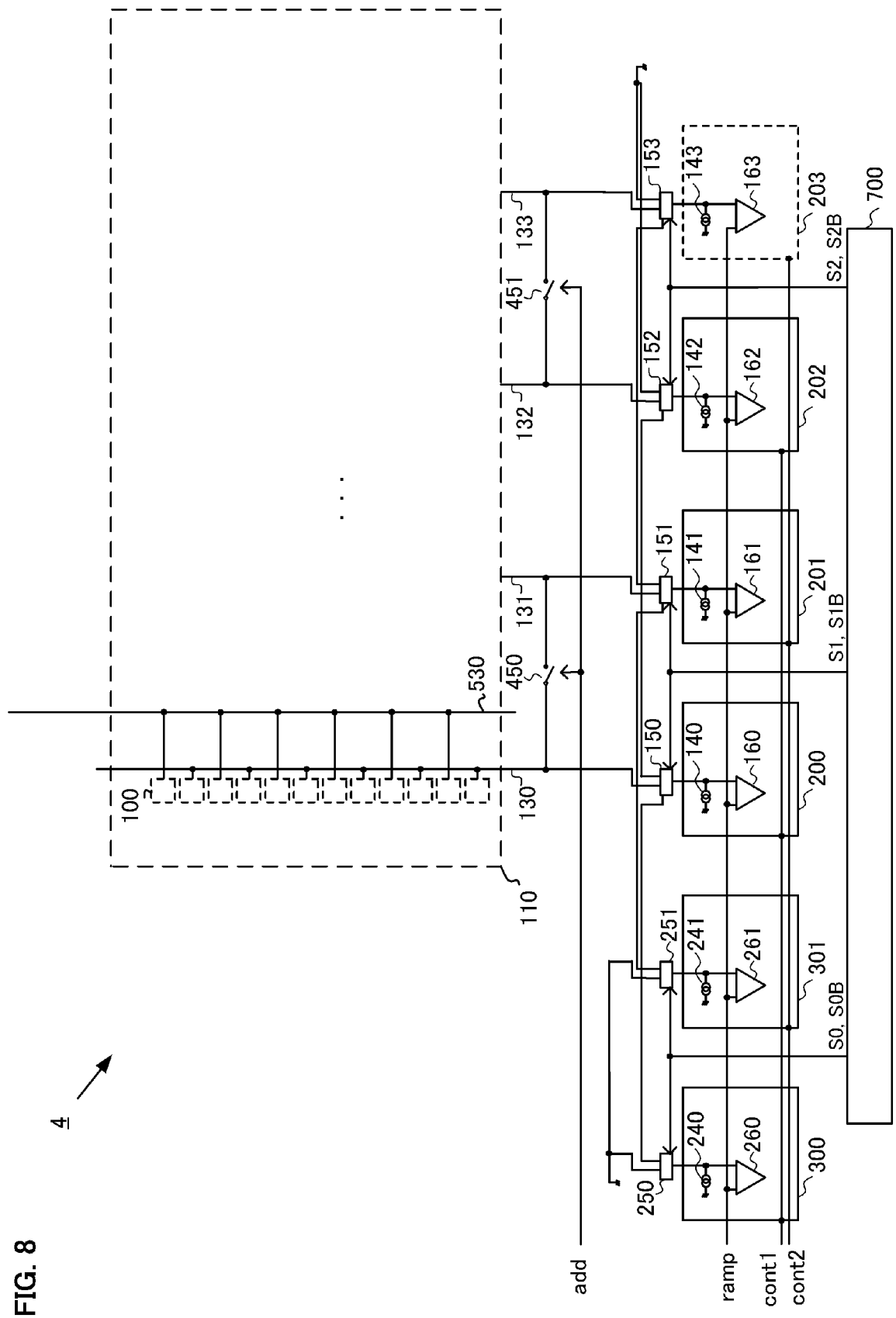
FIG. 8 is a schematic diagram of a photoelectric conversion apparatus according to Embodiment 4.

FIG. 8 is a schematic diagram of a photoelectric conversion apparatus according to Embodiment 4. In the following, differences from Embodiment 1 will be primarily described. For the configuration that is not referred to here, description of Embodiment 1 to Embodiment 3 is applied. The photoelectric conversion apparatus in FIG. 8 includes switches 450 and 451. The switches 450 and 451 connect two adjacent signal lines respectively. In concrete terms, the switch 450 connects the signal lines 130 and 131, and the switch 451 connects the signal lines 132 and 133. The connection states of the switches 450 and 451 are controlled by a control signal add.

In Embodiment 4, signals of different pixel columns can be added because the switches 450 and 451 are included.

This addition operation does not change regardless whether the redundant column circuits 300 and 301 are used or not, hence the addition operation can be easily implemented.

Figure 9:
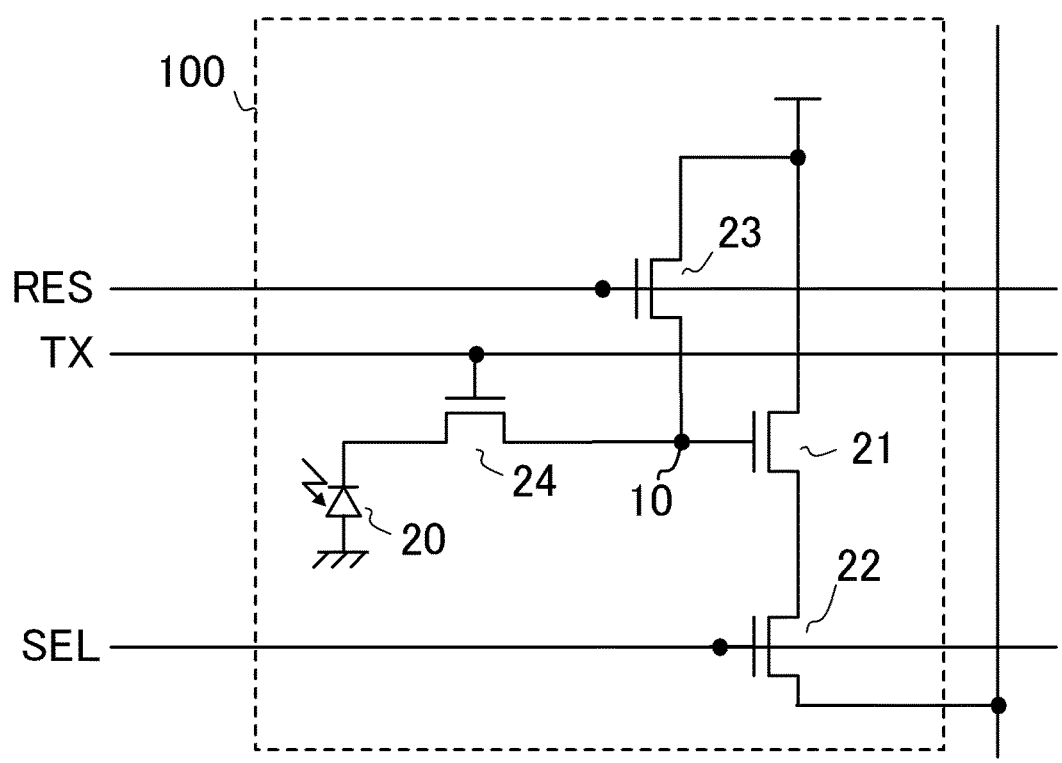
FIG. 9 is a diagram depicting a circuit example of a pixel.
Figure 10:
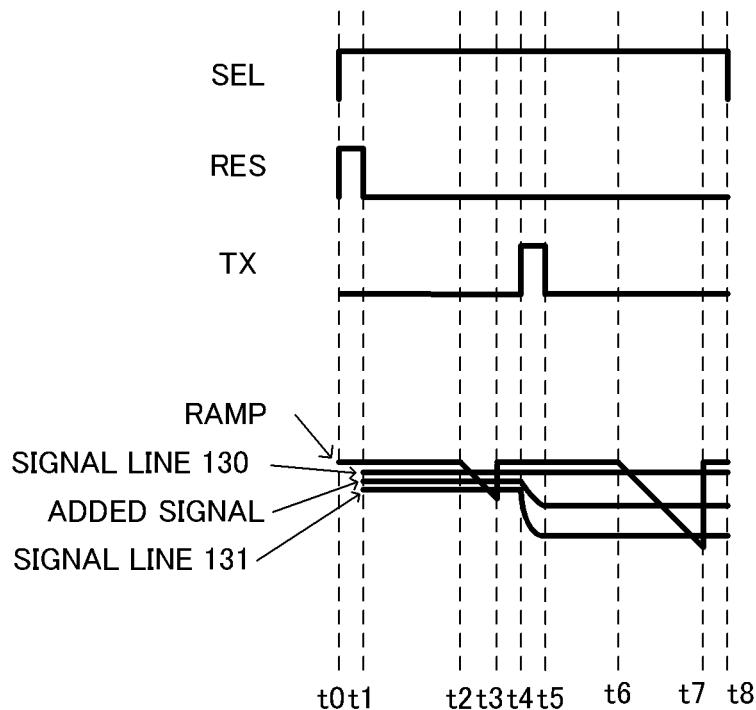
FIG. 10 is a diagram depicting an operation waveform example according to Embodiment 4.

FIG. 9 indicates an example of the circuit of the pixel 100. FIG. 10 indicates an example of the operation waveforms of the pixel 100 when addition is performed and when addition is not performed. In FIG. 9, 10 is a floating diffusion, 20 is a photodiode, 21 is a source follower transistor, 22 is a selection transistor, 23 is a reset transistor, and 24 is a transfer transistor. Wiring of a control signal SEL is connected to the gate of the selection transistor 22. This wiring is commonly used for the same pixel row. Wiring of a control signal RES is connected to the gate of the reset transistor 23. This wiring is commonly used for the same pixel row. And wiring of a control signal TX is connected to the gate of the transfer transistor 24. This wiring is commonly used for the same pixel row.

In FIG. 10, the control signal SEL is at high level at time t0. Thereby in the pixel line from which the signal is output, the selection transistor 22 is turned ON. This means that the source follower transistor 21 forms a source follower with a current source in the column circuit. By turning the reset transistor 23 ON/OFF (time t0 to t1) in this state, the floating diffusion 10 is reset, and the pixel 100 enters the state of outputting the reset level. In FIG. 10, the waveforms indicated by "signal line 130" and "signal line 131" are examples of the operation waveforms of the respective signal lines when the signals are not added. The reason why the reset levels are different is primarily because of the fixed pattern noise (e.g. difference of thresholds of the source follower transistor 21) and the random noise generated at reset. The waveform indicated by "added" is an example of the waveform generated when these signal lines are connected by turning the switch 450 ON. By this addition, the reset level becomes an average value between the reset levels of the signal lines 130 and 131. At time t2, the RAMP signal starts to slope-down. By making the time until the level of the RAMP signal becomes approximately the same as the reset level of the signal lines, that is, by measuring the time until the two waveforms cross in FIG. 10 using the comparators and the counters (not illustrated) in the column circuit in FIG. 8, the reset level is AD-converted. Then by turning the transfer transistor 24 (time t4 to t5) ON/OFF, the negative charges stored in the photodiode 20 are transferred to the floating diffusion 10, and the potential of the floating diffusion 10 drops in accordance with the charge amount. Responding to this, the potential of the signal line drops. In FIG. 10, the waveform of the signal of the signal line 130 indicates an example of a dark time (state of electrons not being generated by incident light), where potential does no change in time t4 to t5. The waveform of the signal of the signal line 131, on the other hand, indicates the light time (state of a certain amount of electrons being generated by incident light), where the potential drops in time t4 to t5. When the signals are added, an average signal of these signals is acquired. In time t6 to t7, the RAMP signal slops down again, whereby the signal level is AD-converted. By detecting the difference between the signal level and the AD conversion result of the reset level, noise caused by the threshold dispersion of the source follower transistor 21, for example, can be cancelled.

As described above, if the switch 450 is turned ON, the signal of the pixel 100 connected to the signal line 130 and the signal of the pixel 100 connected to the signal line 131 are averaged, and appear on the signal lines 130 and 131. If no failure occurs in the column circuits 200 and 201, this signal is input to the comparators 160 and 161. If a failure occurs in the column circuits 200 and 201, this signal is input to the comparators 260 an d 261 by inverting S0, S0B, S1 and S1B. In both cases, addition can be performed by a similar operation of the switch 450. Therefore the advantage of the addition method in FIG. 8 is that installation is easy.

When the addition is performed by the operation of the switch 450, the same signal is input to the two multiplexers 150 and 151. Therefore cont1/2 may be used as a signal to control power saving for the column circuits 200 to 203 and the redundant column circuits 300 and 301, so that either one of the even columns or odd columns is set to the power saving state to reduce power consumption. By controlling the multiplexers according to Embodiment 4, an even column and odd column are simultaneously shifted. This means that the same power save control can be performed regardless whether shift occurred, hence power save control is easy.

Figure 11:
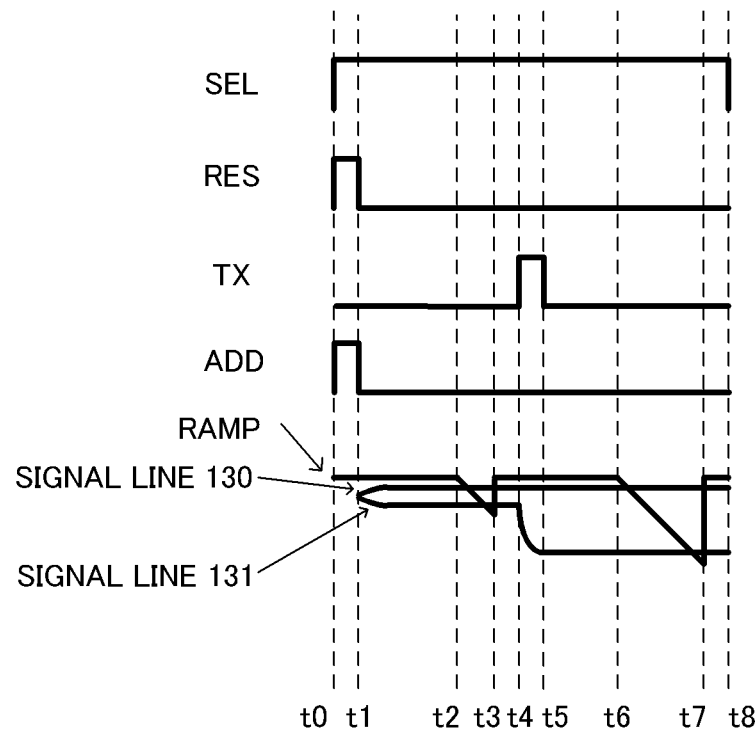
FIG. 11 is a diagram depicting an operation waveform example according to Embodiment 4.

The switches 450 and 451 may be used by changing the ON/OFF of the pulse. In this case as well, this change can be performed without changing the operation depending on whether the redundant column circuits 300 and 301 are used or not. FIG. 11 indicates a waveform example of this operation. For example, as indicated in FIG. 11, the control signal ADD may be set to high level, so that the switches 450 and 451 are turned ON only in a period of time t0 to t1 when RES is set to high level.

Since the signal lines can drive using the source follower transistors 21 of a plurality of pixels, high-speed processing can be expected. For example, in some cases the potential of the signal line 130 may be low, as described in FIG. 10 when the previous pixel signal is read out. In this case, in order to output the signal at the reset level to the signal line 130, the source follower transistor 21 of the pixel connected to the signal line 130 supplies current to the signal line 130. Here the switch 450 is ON, hence the current from the source follower transistor 21 of the pixel connected to the signal line 131 is also supplied to the signal line 130. As a result, the processing speed of charging and discharging of the signal line 130 increases, and the potential of the signal line 130 is quickly settled at the reset level. In this case, at the time t1 when the switch 450 is turned OFF, the potential values of the vertical lines 130 and 131 are the same, but are generally settled to the respective reset levels after the time t1.

Embodiment 5

Figure 12:
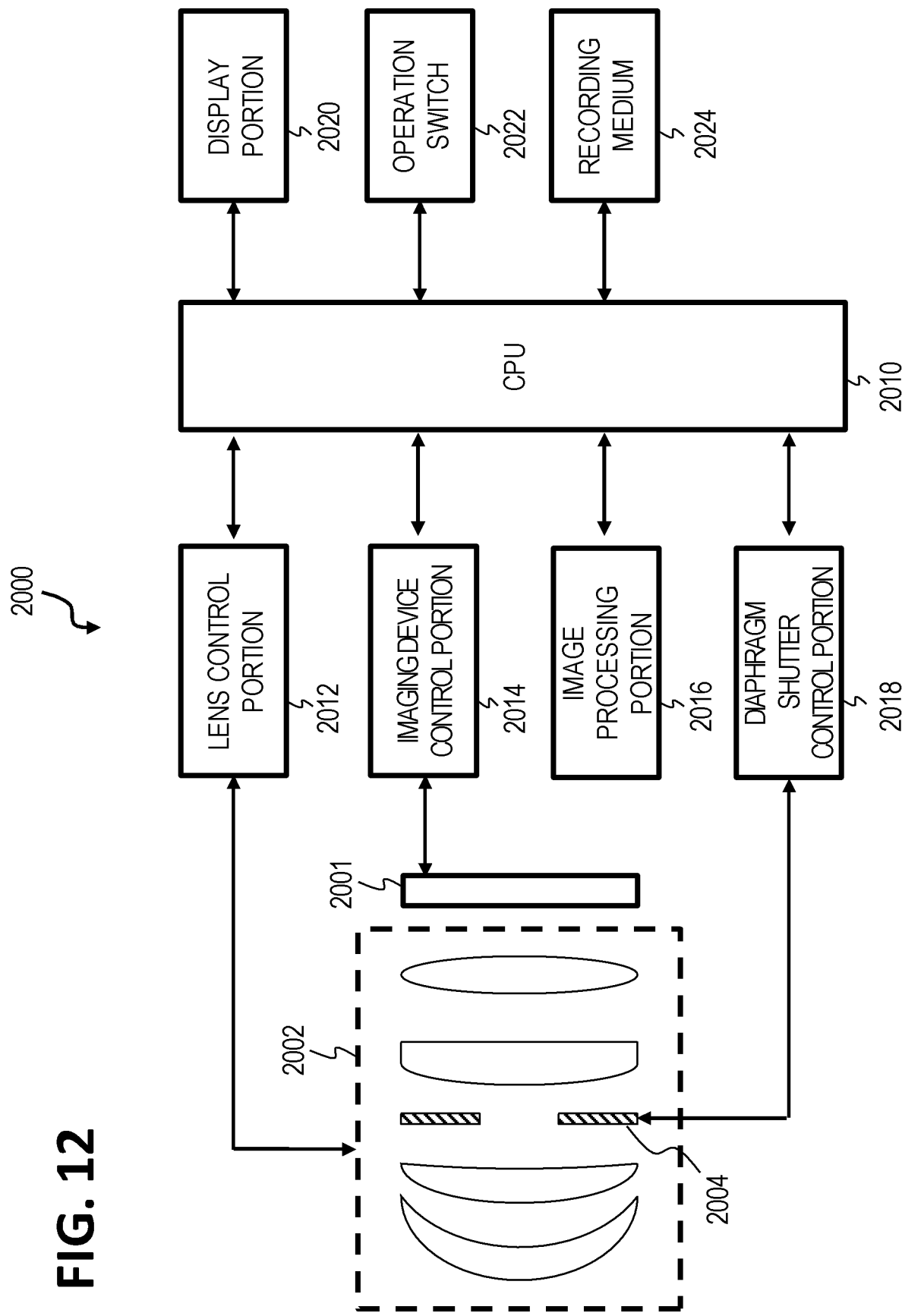
FIG. 12 is a diagram depicting a configuration example of an imaging system according to Embodiment 5.

An imaging system according to a fifth embodiment of the present invention will be explained with reference to FIG. 12. FIG. 12 is a block diagram of a schematic configuration of an imaging system according to this embodiment.

The solid-state imaging devices (photoelectric conversion devices) described in the above first to fourth embodiments may apply to various imaging systems. Applicable imaging systems may include, but are not limited to, various types of equipment such as a digital still camera, a digital camcorder, a monitor camera, a copying machine, a facsimile, a mobile phone, an in-vehicle camera, an observation satellite, a medical camera, or the like. The imaging systems may also include a camera module including an optical system such as a lens and a solid-state imaging device (photoelectric conversion device). FIG. 12 is a block diagram of a digital still camera as an example of those imaging systems.

FIG. 12 shows an imaging system 2000, which includes an imaging device 2001, an imaging optical system 2002, a CPU 2010, a lens control portion 2012, an imaging device control portion 2014, an image processing portion 2016, and a diaphragm shutter control portion 2018. The imaging system 2000 also includes a display portion 2020, an operation switch 2022, and a recording medium 2024.

The imaging optical system 2002 is an optical system for forming an optical image of the subject, and includes a lens group, a diaphragm 2004, or the like. The diaphragm 2004 has a function of adjusting light intensity during photography by adjusting its opening size. The diaphragm 2004 also functions as an exposure time adjustment shutter during still image photography. The lens group and the diaphragm 2004 are held movable forward and backward in the optical axis direction. These linked operations may provide a scaling function (zoom function) and a focus adjustment function. The imaging optical system 2002 may be integrated into the imaging system or may be an imaging lens mountable to the imaging system.

The imaging device 2001 is disposed such that its imaging plane is positioned in the image space of the imaging optical system 2002. The imaging device 2001 is one of the solid-state imaging devices (photoelectric conversion devices) explained in the first to fourth embodiments. The imaging device 2001 includes a CMOS sensor (pixel portion) and its peripheral circuits (peripheral circuit area). The imaging device 2001 includes a plurality of pixels arranged in two dimensions, each pixel including a photoelectric conversion portion. These pixels are provided with color filters to form a two-dimensional single-plate color sensor. The imaging device 2001 may photoelectrically convert a subject image imaged by the imaging optical system 2002 for output as an image signal and/or a focus detection signal.

The lens control portion 2012 is to control the forward and backward driving of the lens group in the imaging optical system 2002 to perform scaling operation and focus adjustment. The lens control portion 2012 includes a circuit and/or processing unit configured to achieve those functions. The diaphragm shutter control portion 2018 is to change the opening size of the diaphragm 2004 (for a variable diaphragm value) to adjust light intensity during photography, and is constituted of a circuit and/or processing unit configured to achieve those functions.

The CPU 2010 is a control unit in a camera responsible for various controls of the camera body, and includes an operation portion, a ROM, a RAM, an A/D converter, a D/A converter, a communication interface circuit, or the like. The CPU 2010 controls the operation of each portion in the camera according to a computer program stored in a ROM or the like. The CPU 2010 performs a series of photography operations such as AF, imaging, image processing, and recording, including detection of the focus state (focus detection) of the imaging optical system 2002. The CPU 2010 also serves as a signal processing portion.

The imaging device control portion 2014 is to control the operation of the imaging device 2001 and to A/D convert a signal output from the imaging device 2001 and transmit the result to the CPU 2010, and includes a circuit and/or control unit configured to achieve those functions. The imaging device 2001 may have the A/D conversion function. The image processing portion 2016 is a processing unit that subjects the A/D converted signal to processing such as Y conversion and color interpolation to generate an image signal. The image processing portion 2016 includes a circuit and/or control unit configured to achieve those functions. The display portion 2020 is a display device such as a liquid crystal display device (LCD), and displays information related to a photography mode of the camera, a preview image before photography, a check image after photography, the focused state at the focus detection, or the like. The operation switch 2022 includes a power supply switch, a release (photography trigger) switch, a zoom operation switch, a photography mode selection switch, or the like. The recording medium 2024 is to record a photographed image or the like, and may be built in the imaging system or removable such as a memory card.

In this way, the imaging system 2000 applied with the imaging device 2001 according to the first to fourth embodiments may provide a high performance imaging system.

Embodiment 6

Figure 13A:
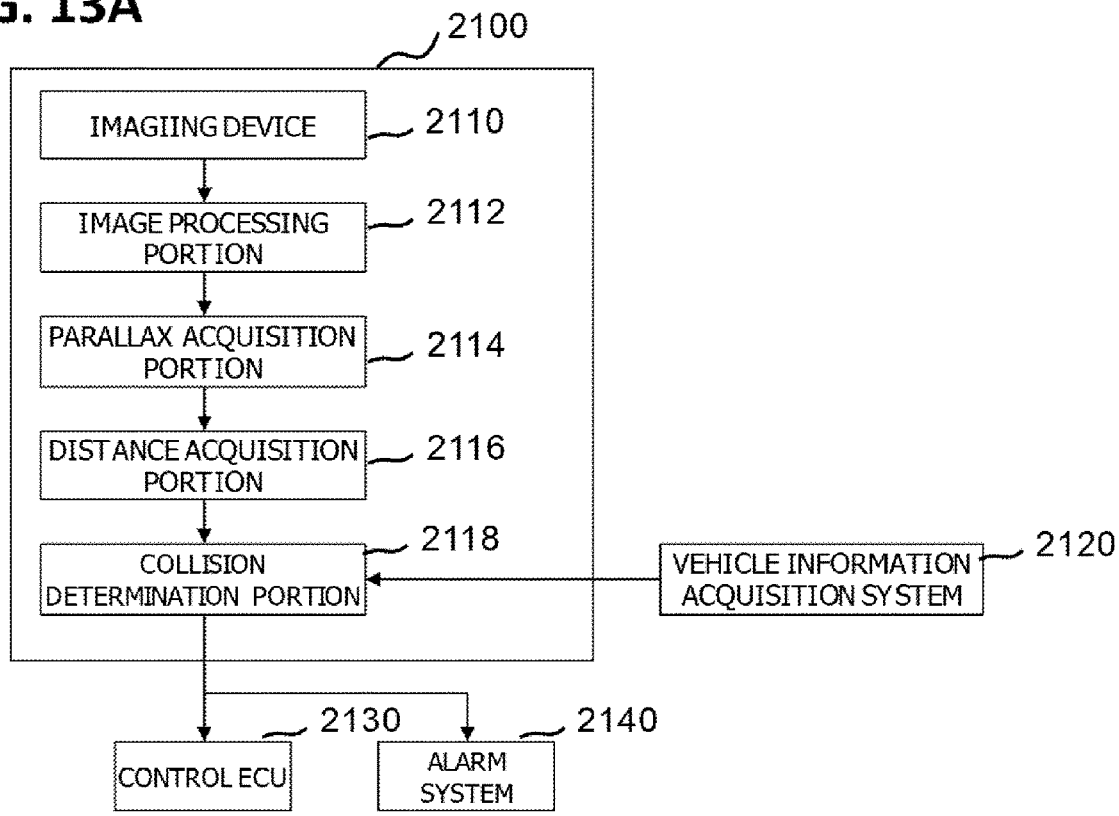
FIG. 13A and FIG. 13B are diagrams depicting configuration examples of an imaging system and a mobile body according to Embodiment 6.
Figure 13B:
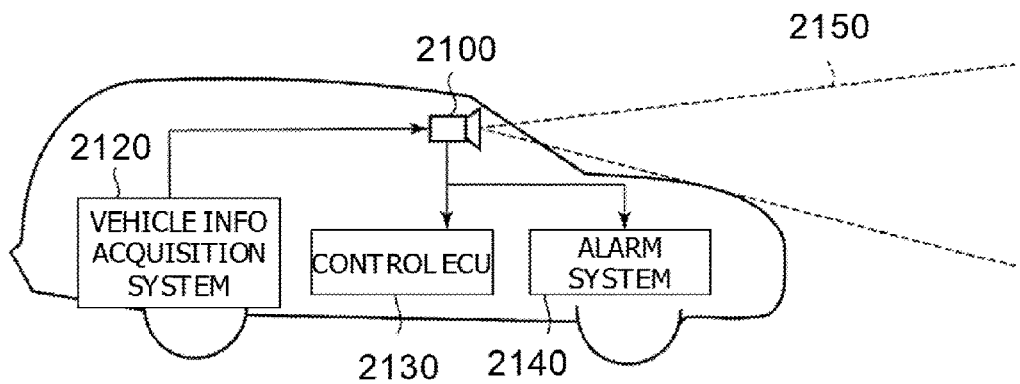

An imaging system and a mobile object according to a sixth embodiment of the present invention will be explained with reference to FIGS. 13A and 13B. FIGS. 13A and 13B show configurations of the imaging system and mobile object according to this embodiment.

FIG. 13A shows an example of an imaging system 2100 associated with an in-vehicle camera. The imaging system 2100 has an imaging device 2110. The imaging device 2110 is any one of the solid-state imaging devices (photoelectric conversion devices) according to the above first to fifth embodiments. The imaging system 2100 has an image processing portion 2112 and a parallax acquisition portion 2114. The image processing portion 2112 is a processing unit that subjects a plurality of sets of image data acquired by the imaging device 2110 to image processing. The parallax acquisition portion 2114 is a processing unit that calculates parallax (a phase difference of a parallax image) from the sets of image data acquired by the imaging device 2110. The imaging system 2100 also includes a distance acquisition portion 2116, which is a processing unit that calculates the distance to the subject based on the calculated parallax. The imaging system 2100 also includes a collision determination portion 2118, which is a processing unit that determines a possibility of collision based on the calculated distance. Here, the parallax acquisition portion 2114 and the distance acquisition portion 2116 are examples of information acquiring means that acquires information such as distance information to the subject. In other words, the distance information is information related to parallax, defocus amount, the distance to the subject, or the like. The collision determination portion 2118 may determine a possibility of collision using any of the distance information. The above processing unit may be provided by specially designed hardware or may be provided by general hardware that performs operation based on a software module. In addition, the processing unit may be provided by a Field Programmable Gate Array (FPGA), an Application Specific Integrated Circuit (ASIC), or the like or may be provided by a combination thereof.

The imaging system 2100 is connected to a vehicle information acquisition system 2120, and may thus acquire vehicle information including a vehicle speed, a yaw rate, and a rudder angle. The imaging system 2100 also has a control ECU 2130 connected thereto. The ECU 2130 is a control unit that outputs a control signal for generating a braking force to the vehicle based on the determination by the collision determination portion 2118. In other words, the control ECU 2130 is an example of a mobile object control means that controls a mobile object based on the distance information. The imaging system 2100 is also connected to an alarm system 2140. The alarm system 2140 gives an alarm to the driver based on the determination by the collision determination portion 2118. For example, if the collision determination portion 2118 determines a high possibility of collision, the control ECU 2130 performs a vehicle control that avoids collision and reduces damage by braking, releasing the accelerator, limiting the engine output, or the like. The alarm system 2140 warns the user by sounding an alarm such as sound, displaying alarm information on a screen of a car navigation system or the like, giving vibration to a seatbelt and steering, or the like.

In this embodiment, the surroundings of the vehicle such as front or rear are imaged by the imaging system 2100. FIG. 13B shows the imaging system 2100 when imaging the front of the vehicle (imaging range 2150). The vehicle information acquisition system 2120 directs the imaging system 2100 to operate and perform imaging. Using the imaging devices according to the above first to fifth embodiments as the imaging device 2110, the imaging system 2100 in this embodiment may provide more improved ranging accuracy.

Although the above description shows an example control that prevents collision with other vehicles, the present invention may also apply to a control of autonomous driving following other vehicles, a control of autonomous driving preventing running over a traffic lane, or the like. In addition to a vehicle such as a car, the imaging system may also apply to, for example, a mobile object (transportation equipment) such as a vessel, an aircraft, or an industrial robot. The moving device in the mobile object (transportation equipment) is one of various types of drive sources, including an engine, a motor, a wheel, and a propeller. In addition to a mobile object, the imaging system may also apply to equipment, such as Intelligent Transport Systems (ITS), that commonly uses the object recognition.

Other Embodiment

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-118701, filed on Jun. 26, 2019, which is hereby incorporated by reference herein in its entirety.

What is claimed is:

1. A photoelectric conversion apparatus, comprising:
    a pixel array that includes a plurality of pixels disposed two-dimensionally;
    a first signal line group and a second signal line group that each read out signals of the pixel array;
    a first readout circuit group of which each first readout circuit reads out a signal from at least one signal line of the first signal line group;
    a second readout circuit group of which each second readout circuit reads out a signal from at least one second signal line of the second signal line group;
    a first multiplexer group that selects one of at least two first signal lines of the first signal line group, and connects the selected first signal line to one first readout circuit of the first readout circuit group; and
    a second multiplexer group that selects one of at least two second signal lines of the second signal line group, and connects the selected second signal line to one second readout circuit of the second readout circuit group,
    wherein a number of the first readout circuits is more than a number of the first signal lines,
    wherein a number of the second readout circuits is more than a number of the second signal lines,
    wherein the selection operation by the first multiplexer group and the selection operation by the second multiplexer group are executable independently from each other,
    wherein the selection operation of the first multiplexer group is controlled collectively, and
    wherein the selection operation of the second multiplexer group is controlled collectively.

2. The photoelectric conversion apparatus according to claim 1, wherein a pixel column connected to one second signal line of the second signal line group is disposed between two pixel columns connected to two first signal lines of the first signal line group respectively.

3. The photoelectric conversion apparatus according to claim 1,
    wherein each first signal line of the first signal line group is a signal line to read a signal of a pixel column on an odd column, and
    wherein each second signal line of the second signal line group is a signal line to read a signal of a pixel column on an even column.

4. The photoelectric conversion apparatus according to claim 1, wherein one pixel column includes a pixel connected to one first signal line of the first signal line group, and a pixel connected to one second signal line of the second signal line group.

5. The photoelectric conversion apparatus according to claim 1, further comprising:
    a third signal line group and a fourth signal line group that readout signals of the pixel array respectively;
    a third readout circuit group of which each third readout circuit reads out a signal from at least one third signal line of the third signal line group;
    the fourth readout circuit group of which each fourth readout circuit reads out a signal from at least one fourth signal line of the fourth signal line group;
    a third multiplexer group that selects one of at least two third signal lines of the third signal line group, and connects the selected third signal line to one third readout circuit of the third readout circuit group; and a fourth multiplexer group that selects one of at least two fourth signal lines of the fourth signal line group, and connects the selected fourth signal line to one fourth readout circuit of the fourth readout circuit group, wherein the pixel array includes a first pixel column and a second pixel column which are adjacent to each other, wherein the first pixel column includes a pixel connected to one first signal line of the first signal line group and a pixel connected to one second signal line of the second signal line group, wherein the second pixel column includes a pixel connected to one third signal line of the third signal line group and a pixel connected to one fourth signal line of the fourth signal line group, and wherein the selection operations by the first to fourth multiplexer groups are executable independently from one another.

6. A photoelectric conversion apparatus, comprising:
a pixel array that includes a plurality of pixels disposed two-dimensionally;
a first signal line group and a second signal line group that each readout signals of the pixel array;
a first readout circuit group of which each first readout circuit reads out a signal from at least one first signal line of the first signal line group;
a second readout circuit group of which each second readout circuit reads out a signal from at least a second signal line of the second signal line group;
a first multiplexer that selects one of at least the first signal lines of the first signal line group, and connects the selected first signal line to one first readout circuit of the first readout circuit group;
a second multiplexer that selects one of at least two second signal lines of the second signal line group, and connects the selected second signal line to one second readout circuit of the second readout circuit group,
wherein the pixel connected to one first signal line of the first signal line group and the pixel connected to one second signal line of the second signal line group are disposed on a same pixel column.

7. The photoelectric conversion apparatus according to claim 6, wherein
the first signal line and the second signal line are signal lines to read signals of the pixels of different rows on a same pixel column.

8. The photoelectric conversion apparatus according to claim 1,
wherein a first multiplexer of the first multiplexer group is capable of switching: (1) an operation to connect a corresponding first signal line of the first signal line group to a corresponding first readout circuit of the first readout circuit group; and (2) an operation to connect another first multiplexer of the first multiplexer group to the corresponding first readout circuit of the first readout circuit group, and connect the corresponding first signal line of the first signal line group to still another first multiplier, and
wherein a second multiplexer of the second multiplexer group is capable of switching: (3) an operation to connect a corresponding second signal line of the second signal line group to a corresponding second readout circuit of the second readout circuit group; and (4) an operation to connect another second multiplexer of the second multiplexer group to the corresponding second readout circuit of the second readout circuit group, and connect the corresponding second signal line of the second signal line group to still another second multiplexer.

9. The photoelectric conversion apparatus according to claim 1,
wherein a first multiplexer of the first multiplexer group includes an input node that is connected to a corresponding first signal line of the first signal line group, and an input node that is connected to another first signal line of the first signal line group, and
wherein a second multiplexer of the second multiplexer group includes an input node that is connected to a corresponding second signal line of the second signal line group, and an input node that is connected to another second signal line of the second signal line group.

10. The photoelectric conversion apparatus according to claim 1, further comprising a control circuit that supplies common control signals to a first multiplexer of the first multiplexer group and a second multiplexer of the second multiplexer group which are adjacent to each other.

11. The photoelectric conversion apparatus according to claim 1, further comprising a control circuit that supplies control signals which are independent from each other to a first multiplexer of the first multiplexer group and a second multiplexer of the second multiplexer group which are adjacent to each other.

12. A photoelectric conversion apparatus, comprising:
a pixel array that includes a plurality of pixels disposed two-dimensionally;
a first signal line group and a second signal line group that each reads out signals of the pixel array;
a first readout circuit group including a readout circuit corresponding to each first signal line of the first signal line group and a readout circuit that is redundantly disposed for the first signal line group and the second signal line group;
a second readout circuit group including a readout circuit corresponding to each second signal line of the second signal line group and a readout circuit that is redundantly disposed for the first signal line group and the second signal line group;
a first multiplexer that is capable of switching whether at least one first signal line of the first signal line group is connected to a corresponding readout circuit or to a readout circuit that is different from the corresponding readout circuit; and
a second multiplexer that is capable of switching whether at least one second signal line of the second signal line group is connected to a corresponding readout circuit or to a readout circuit that is different from the corresponding readout circuit,
wherein the first multiplexer and the second multiplexer perform the same operation to determine whether the first signal line or the second signal line is connected to a corresponding readout circuit or a readout circuit that is different from the corresponding readout circuit.

13. The photoelectric conversion apparatus according to claim 1, wherein control lines which are independent from each other are connected to the first readout circuit group and the second readout circuit group.

14. The photoelectric conversion apparatus according to claim 13, wherein the control line is a bias line to control current consumption values.

15. The photoelectric conversion apparatus according to claim 13, wherein the control line is a control line to switch operation of each readout circuit ON/OFF.

16. The photoelectric conversion apparatus according to claim 13,
wherein each first readout circuit of the first readout circuit group and each second readout circuit of the second readout circuit group include a comparator, and
wherein the control line is a control line to control the reset operation of the comparator.

17. The photoelectric conversion apparatus according to claim 16, wherein the timing to reset the comparator of the first readout circuit group and the timing to reset the comparator of the second readout circuit group are different.

18. An imaging system, comprising:
the photoelectric conversion apparatus according to claim 1; and
a signal processing unit that processes a signal that is output from the photoelectric conversion apparatus.

19. A mobile body, comprising:
the photoelectric conversion apparatus according to claim 1;
a mobile apparatus;
a processing apparatus that acquires information from signals output from the photoelectric conversion apparatus; and
a control apparatus that controls the mobile apparatus based on the information.

20. A signal processing apparatus, comprising:
a first signal line group and a second signal line group;
a first readout circuit group of which each first readout circuit reads out a signal from at least one first signal line of the first signal line group;
a second readout circuit group of which each second readout circuit reads out a signal from at least one second signal line of the second signal line group;
a first multiplexer group that selects one of at least two first signal lines of the first signal line group, and connects the selected first signal line to one first readout circuit of the first readout circuit group; and
a second multiplexer group that selects one of at least two second signal lines of the second signal line group, and connects the selected second signal line to one second readout circuit of the second readout circuit group,
wherein a number of the first readout circuits is more than a number of the first signal lines,
wherein a number of the second readout circuits is more than a number of the second signal lines,
wherein the selection operation by the first multiplexer group and the selection operation by the second multiplexer group are executable independently from each other,
wherein the selection operation of the first multiplexer group is controlled collectively, and
wherein the selection operation of the second multiplexer group is controlled collectively.

* * * * *